United States Patent
Beutel et al.

(10) Patent No.: US 11,378,596 B2
(45) Date of Patent: Jul. 5, 2022

(54) ARRANGEMENT HAVING A SPIRALED CONDUCTOR STRAND, AND METHOD FOR PRODUCING SUCH AN ARRANGEMENT

(71) Applicant: Siemens Energy Global GmbH & Co. KG, Munich (DE)

(72) Inventors: Stefan Beutel, Berlin (DE); Benjamin Huth, Berlin (DE); Wojciech Olszewski, Berlin (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 17/261,946

(22) PCT Filed: Jun. 20, 2019

(86) PCT No.: PCT/EP2019/066315
§ 371 (c)(1),
(2) Date: Jan. 21, 2021

(87) PCT Pub. No.: WO2020/015949
PCT Pub. Date: Jan. 23, 2020

(65) Prior Publication Data
US 2021/0302473 A1 Sep. 30, 2021

(30) Foreign Application Priority Data

Jul. 20, 2018 (DE) .......................... 102018212144.3

(51) Int. Cl.
*G01R 15/18* (2006.01)

(52) U.S. Cl.
CPC ................................ *G01R 15/181* (2013.01)

(58) Field of Classification Search
CPC ................................ G01R 15/181; G01R 3/00
See application file for complete search history.

(56) References Cited

U.S. PATENT DOCUMENTS

| | | |
|---|---|---|
| 3,626,291 A | 12/1971 | Yauch et al. |
| 3,974,440 A | 8/1976 | Schiemann et al. |
| 6,114,847 A | 9/2000 | Johnson |
| 6,300,857 B1 | 10/2001 | Herwig |
| 7,902,950 B2 | 3/2011 | Yang et al. |
| 2006/0176140 A1 | 8/2006 | Skendzie et al. |
| 2011/0025304 A1 | 2/2011 | Lint et al. |
| 2013/0063125 A1 | 3/2013 | Chamarti et al. |
| 2014/0327509 A1 | 11/2014 | Lacerda |

(Continued)

FOREIGN PATENT DOCUMENTS

| | | |
|---|---|---|
| DE | 3708731 C1 | 6/1988 |
| DE | 112006003886 T5 | 5/2009 |
| EP | 2275827 A2 | 1/2011 |

(Continued)

*Primary Examiner* — Christopher E Mahoney
(74) *Attorney, Agent, or Firm* — Laurence A. Greenberg; Werner H. Stemer; Ralph E. Locher

(57) ABSTRACT

An arrangement includes a spiralled conductor strand supported by a winding support. The winding support is a ring and is assembled from a plurality of segments abutting one another. At a first abutment the spiralled conductor strand ends on both sides of the abutment so as to leave the same free, and at a second abutment the conductor strand runs beyond the second abutment. A method for producing a measuring transformer is also provided.

11 Claims, 6 Drawing Sheets

(56) References Cited

U.S. PATENT DOCUMENTS

2018/0100878 A1* 4/2018 Pearce .................. H01R 13/73
2020/0388436 A1* 12/2020 Sattel ................. G01R 19/0092

FOREIGN PATENT DOCUMENTS

| EP | 3241513 A1 | 11/2017 |
| WO | WO0122100 A1 | 3/2001 |
| WO | WO2013186420 A1 | 12/2013 |

* cited by examiner

… (1)

ARRANGEMENT HAVING A SPIRALED CONDUCTOR STRAND, AND METHOD FOR PRODUCING SUCH AN ARRANGEMENT

BACKGROUND OF THE INVENTION

Field of the Invention

The invention relates to an arrangement having a spiraled conductor strand, which is supported by a winding support.

Such a spiraled conductor strand is disclosed, for example, in the patent specification DE 37 08 731 C1. Said document describes a bifilar wound Rogowski coil having a center tap which has been applied to a winding support. The winding support in said document is divided into two, as a result of which movability of the winding support with the spiraled conductor strand arranged thereon is made possible. One disadvantage consists in that, during a movement, always the same section of the spiraled conductor strand is subjected to reshaping. Furthermore, it is necessary to make contact with the provided conductor ends of the conductor strand using a detachable connection, with the result that it is possible for them to lift up and slip over the winding body as well as the spiraled conductor strand. The known arrangement has the disadvantage that, firstly, during a movement, always the same sections of the conductor strand are subjected to mechanical loading, as a result of which, firstly, premature ageing can be expected, and secondly, owing to this movement, the position of the conductor strand is shifted, as a result of which the preciseness of the spiraled conductor strand is influenced. Furthermore, it is disadvantageous that, on opening, detachment or connection of the conductor strand is necessary.

SUMMARY OF THE INVENTION

The object of the invention therefore consists in specifying an arrangement which makes available a spiraled conductor strand with long-term stability alongside reduced production costs.

In accordance with the invention, the object is achieved in the case of the arrangement mentioned at the outset by virtue of the fact that the winding support is a ring comprising a plurality of mutually abutting segments, wherein, at at least one first abutment, the spiraled conductor strand ends on both sides of the abutment whilst leaving the abutment free, and, at a second abutment, the conductor strand runs beyond the second abutment.

A winding support is used as the basis for receiving a spiraled conductor strand. The conductor strand is preferably designed to be electrically insulated and is laid around the winding support in the form of a helix. This results in a conductor strand with a multiplicity of loops, as a result of which a so-called Rogowski coil can be formed. The winding support passes through the loops. The winding support can be formed from a plurality of mutually abutting segments, with the result that a ring which is closed per se is produced, on which the spiraled conductor strand extends in particular uniformly distributed. Owing to the arrangement of the conductor strand on the winding support, firstly simple production can take place, and secondly stabilization of the conductor strand by the winding support itself is provided, with the result that reshaping or deformation of the spiraled conductor strand is made more difficult. Correspondingly, it is advantageous that, at a first abutment, the conductor strand ends on both sides of the abutment whilst leaving the abutment free, and, at a second abutment, the conductor strand runs beyond the abutment. Therefore, over the course of the closed ring at an abutment point a possibility is provided in a simple form of opening the abutment point without in the process needing to separate or connect the conductor strand. Electrical contact can therefore be made with the conductor strand permanently. In this case, starting from the abutment at which the conductor strand performs an electrical bridge, winding of the conductor strand on both sides of the abutment takes place to form the abutment that is left free, with the result that a spiraled conductor strand with a slot over the course of the ring of the winding support is produced. There is therefore the possibility of providing a center tap of the conductor strand, in particular at the abutment at which an electrical bridge takes place. At the first abutment, the conductor strand can come close to the first abutment on the segments located on both sides of the abutment. When the abutment is reached, in each case a turning point can take place over the course of the conductor strand and it can be passed back to the second abutment. For this purpose, the conductor strand can be divided into strand elements, which together form the conductor strand.

Advantageously, provision can be made here for the spiraled conductor strand to be assembled from a plurality of strand elements.

The spiraled conductor strand can be assembled from a plurality of strand elements. In this case, provision can be made for the strand elements to be connected in the region of an abutment between two segments so as to make electrical contact between the two strand elements. The conductor strand can electrically conductively bridge an abutment by virtue of strand elements being brought into electrically conductive contact with one another. Advantageously, at the same abutment at which strand elements have been brought into contact with one another, the remaining winding ends (center tap) of the strand elements are passed out, with the result that, in one position around the winding support, contact can be made between the strand elements, and also the ends of the conductor strand can be passed out for connection of the assembled conductor strand to a measuring device, for example.

Advantageously, provision can be made for at least one segment of mutually abutting segments to have a radially protruding stop, which prevents the conductor strand from sliding off at the end.

A protruding stop may be, for example, a collar arranged on a segment at the end, which collar runs approximately perpendicularly around a cross section of the winding support. A stop is thus formed, against which a conductor strand can be wound, with the result that a winding end of the conductor strand can be fixed at the end. Advantageously, the stop is in this case provided in the radial direction with respect to the toroidal axis with a height with respect to the winding area of the winding support which approximately corresponds to the cross section of the conductor strand. Correspondingly, a flush, virtually protrusion-free resting of the conductor strand against the stop can be performed. Preferably, a turning point can be provided in the winding direction of the conductor strand, in particular of a strand element, in a manner so as to lie against/abut the stop. The stop can also be used to bound an abutment between segments.

A further advantageous configuration can provide that the winding support as well as the conductor strand is potted in an insulating body.

Potting the winding support as well as the conductor strand in an insulating body has the advantage that both the winding body and the conductor strand itself can be fixed relative to one another. Furthermore, it is also possible in the case of a segmented division of the winding support to secure the position of the segments with respect to one another by means of potting. It is therefore possible, for example, to arrange identically wound strand elements on in each case identical segments and to achieve, by virtue of joining the identical segments together, a closed convolution of the spiraled conductor strand on an annular path. Advantageously, provision can be made here for, on the respective segment, the free ends of a strand element of a conductor strand to lie at one segment end, and for the other segment end to be kept free of the free ends of the respective strand element of the conductor strand. There, preferably a turning point in the winding sense of a strand element can be arranged. Correspondingly, in particular in the case of a two-part embodiment of a winding support, cases of erroneous fitting can be prevented since in each case the identically embodied ends of the segments can be brought to face one another with respect to the position of the free ends of the strand elements of the conductor strand so as to form an abutment.

Owing to the use of potting in an insulating body, it is possible to use the arrangement as a measuring transformer, wherein an electrical conductor can be passed through the insulating body. The electrical conductor can in this case be subjected to a current flow, with the result that, in the spiraled conductor strand, a physical size which is proportional to the current flow is developed. The insulating body can be used as a fluid-tight barrier.

If required, the insulating body and/or the electrical conductor can have an overflow channel, with the result that passage of a fluid, in particular an insulating gas, is made possible.

Furthermore, provision can advantageously be made for the conductor strand, in particular a strand element, to have been wound onto a segment, wherein, surrounded by the helix formed, a winding end of the conductor strand or winding end of the strand element is passed back within the helix.

In order to form a helix, a conductor strand, in particular a strand element, can be wound onto a segment. In this case, advantageously at one segment end, the process starts with winding the conductor strand or strand element onto the segment and this is continued up to the other end of the segment. Correspondingly, a left-handed or right-handed helix is produced which extends from one segment end to the other segment end. Advantageously, surrounded by the helix thus formed, a winding end of a conductor strand or a winding end of the strand element can be passed back within the helix, with the result that, surrounded by the helix, the strand element can run in the region shielded there. In this case, provision can be made for the strand element likewise to be passed back in a helix, preferably in a helix with an opposite winding sense with respect to the surrounding helix. However, provision can also be made for a curved or linear profile (free of helix loops) of the passed-back section of the strand element or of the conductor strand to take place simply following the profile of the segment. Correspondingly, the end-side ends (winding ends) of the conductor strand or of the strand element can come to bear against one segment end and it is further possible for electrical contact to be made between them or for them to be connected there. The other segment end can thus preferably be kept free of end-side ends of the conductor strand or the strand element (winding ends). At this other end, a turning point can be arranged over the course of the conductor strand/strand element. If required, however, provision can also be made for a center tap of the strand element or of the conductor strand to be provided, as a result of which, for example, starting from a central region of the segment in each case to the ends of the segment, winding of a helix is provided, wherein, in the interior of the helix thus produced, the conductor ends (winding ends) are passed back to the central region of the segment.

A further advantageous configuration can provide for the conductor strand, in particular a strand element, to have been wound onto a segment in such a way that, first, a left-handed helix has been wound and, when an end of a segment has been reached, a right-handed helix has been inserted into free spaces located between the helix loops of the left-handed helix, or vice versa, with respective crossing-over of the two helices.

With the same effect, first a right-handed and then a left-handed helix can be wound. A strand element of a conductor strand can first be wound onto a segment, wherein first a left-handed helix is wound. When the end of a segment is reached, then a right-handed helix is inserted into the interspaces between the helix loops of the left-handed helix. A turning point over the course of the strand element or of the conductor strand is arranged between the right-handed and left-handed helix. As a result, a flush assembly between the left-handed and right-handed helices over the course of the segment of the winding support is achieved, wherein the start of the winding and the end of the winding (free ends, winding ends) come to lie at one and the same end of the segment. At the other opposite end of the segment, only a turning point of the strand element or the conductor strand is arranged. In this case, provision should advantageously be made for a crossover of the two helices to take place between each left-handed or right-handed conductor loop, which in particular lie adjacent to one another alternately over the course of the segment. The crossover points of the two helices should in this case preferably lie in the axial direction with respect to the ring axis of the winding support. Therefore, the inner curve and the outer curve, i.e. the inner diameter and the outer diameter of a ring, are free of crossovers. There, an approximately parallel arrangement of the respective conductor loops of the helices is present. Provision can advantageously be made for the winding support to be provided with a circular cross section. However, it is also possible for provision to be made for, furthermore, for example, rectangular cross sections, polygonal cross sections, oval cross sections etc. to be provided for the winding support. In particular the use of a rectangular cross section makes it possible, when using a plurality of winding supports which are arranged coaxially, to lay said winding supports as tightly against one another as possible.

Advantageously, provision can furthermore be made for the winding support to have a coefficient of thermal expansion which is less than or equal to the coefficient of thermal expansion of the insulating body.

When using the same coefficients of thermal expansion for the winding support and the insulating body, the risk of the occurrence of thermal stresses is reduced. In this case, the coefficient of thermal expansion of the winding support can be less than the coefficient of thermal expansion of the insulating body.

The winding support and the insulating body in which the winding support and the conductor strand are potted are preferably formed from the same material, i.e. from the same electrically insulating material. Suitable materials have proven to be, for example, plastics, in particular organic plastics such as resins or the like. Owing to the use of identical materials for the insulating bodies, identical relative movements result in particular in the case of the occurrence of thermal stresses within the potted body, with the result that ripping or splitting of the subsequently potted winding support is counteracted.

A further advantageous configuration can provide for each of the segments to be constructed identically and to in each case support an identical strand element of the conductor strand.

Owing to the use of identical segments and identical, in particular identically wound strand elements of the conductor strand on the in each case identical segment, an arrangement of a plurality of identical parts can be assembled from one and the same type of segments as well as strand element. Particularly advantageously, provision can be made here for the winding of a strand element on the respective segment to take place in such a way that, beginning at one end of the segment, first a left-handed helix is wound and, having reached the other end of the segment, a turning point is arranged in the strand element of the conductor strand, whereupon a right-handed helix is inserted into the interspaces between the left-handed helix which has already been wound. Correspondingly, in this case a crossover of the left-handed and right-handed helices between each of the left-handed or right-handed helix loops takes place. An identical result is achieved if first a right-handed helix is wound into which a left-handed helix is inserted.

Corresponding segments with wound-on strand elements each have the end-side connection points (ends) of the strand elements only at one end, while only a turning point of the strand element lies at the other end. Therefore, in each case identical ends of wound segments can be brought to face one another, as a result of which erroneous fitting is prevented.

A further configuration can provide for in each case end-side ends of two strand elements to have been brought into contact with one another at mutually abutting segments, while the respective other ends of the strand elements serve as a tap for a measurement signal, in particular at the same abutment.

At the end-side ends (winding ends) of two strand elements and at an abutment positioned there between the segments, electrical contact can be made between first ends of the strand elements, wherein the second ends of the strand elements on the respective segment serve as a tap for the measurement signal. Thus, by making contact with a first end of the strand elements from the two strand elements, an electrically connected spiraled conductor strand is formed, whose remaining free ends have been passed to the outside at one and the same abutment over the course of the winding support. Correspondingly, a spiraled conductor strand with a center tap is formed. Another abutment, in particular at a diametrically oppositely arranged abutment in the case of a circular-ring-shaped two-part formation of the winding support, can thus be held in such a way that it is free of any skipping or overlap by the spiraled conductor strand.

A further advantageous configuration can provide for two annular winding supports to have been arranged coaxially with respect to one another, and, prior to potting in an insulating body, for a spacer to have been arranged between the winding bodies, wherein the spacer has substantially radially aligned channels. In the case of a coaxial arrangement, an axial offset of the winding supports can be fixed by the spacer.

The use of two annular winding bodies and a coaxial arrangement thereof makes it possible to achieve redundancy of the winding bodies. The winding bodies can be arranged so as to be axially offset with respect to one another. By virtue of an identical design of the winding bodies as well as identically spiraled conductor strands, it is thus possible for a signal which is as identical as possible to be tapped off from each of the conductor strands on the respective winding support. Advantageously, between the two winding supports, as well as the conductor strand located thereon, a spacer can be arranged between the winding bodies, with the result that a preferably coaxial alignment of the winding bodies is forced. In this case, the spacer preferably has radially aligned channels in order to transport the potting material over the entire circumference to all regions of the annular winding supports during potting with an electrically insulating material so as to form an insulating body. In this case, the annular winding supports can rest on a ring electrode, which in particular enables a voltage measurement on a phase conductor which is to be surrounded by the annular winding bodies.

A further object consists in using the arrangement in accordance with one of the patent claims in an electrical energy transmission device, in particular in an electrical energy transmission device having pressurized gas insulation.

The object is achieved by the formation of a measuring transformer, which is arranged in a pressurized-fluid-insulated electrical energy transmission device.

An electrical energy transmission device having pressurized gas insulation generally has containers for bounding the pressurized gas insulation, wherein a phase conductor needs to be supported in electrically insulated fashion with respect to the container. Such an electrical insulation can be achieved, for example, by means of an arrangement formed in accordance with the preceding patent claims. For example, an arrangement potted with an electrical insulating material can close a flange opening and thus enclose an electrically insulating gas in the interior of the container of the pressurized-gas-insulated electrical energy transmission device.

A further object of the invention consists in specifying a method for producing a measuring transformer, which has a winding support in the form of an insulating ring, onto which a conductor strand in the form of a spiraled helix has been wound.

In accordance with the invention, the object is achieved in the case of a method of the abovementioned type by virtue of the fact that, first, a first helix is wound onto a first segment and a second helix is wound onto a second segment, the segments are joined together to form a ring in a rim base of a ring electrode, and in that both the ring segments as well as the helices and the ring electrode are potted in an insulating material.

An arrangement of a first helix on a first segment and an arrangement of a second helix on a second segment makes it possible, in a simple form, to surround a ring electrode by virtue of the first segment and the second segment being placed from the radial direction onto the ring. Owing to the use of a ring electrode with a rim base, firstly a radial but also an axial alignment of the first segment and the second segment is thus made possible. Once the ring segments have been aligned with respect to one another, then potting of the ring segments and the helices arranged thereon as well as the ring electrode with insulating material takes place, with the result that a compact block is produced, in which both the insulating ring and the ring electrode are embedded (shrouded) completely. The connecting lines of the helix can be passed to the outside through the insulating material. The ring electrode can in this case, for example, be crossed by a phase conductor via a cutout in the insulating material for potting, which phase conductor, driven by a voltage, conducts an electric current. The electric current can be dissipated over the segments by means of the spiraled conductor strand, whereas the driving voltage can be dissipated by virtue of charging of the electrode.

An exemplary embodiment of the invention will be shown schematically in a drawing and then described in more detail below.

DETAILED DESCRIPTION OF THE INVENTION

Figure 1:
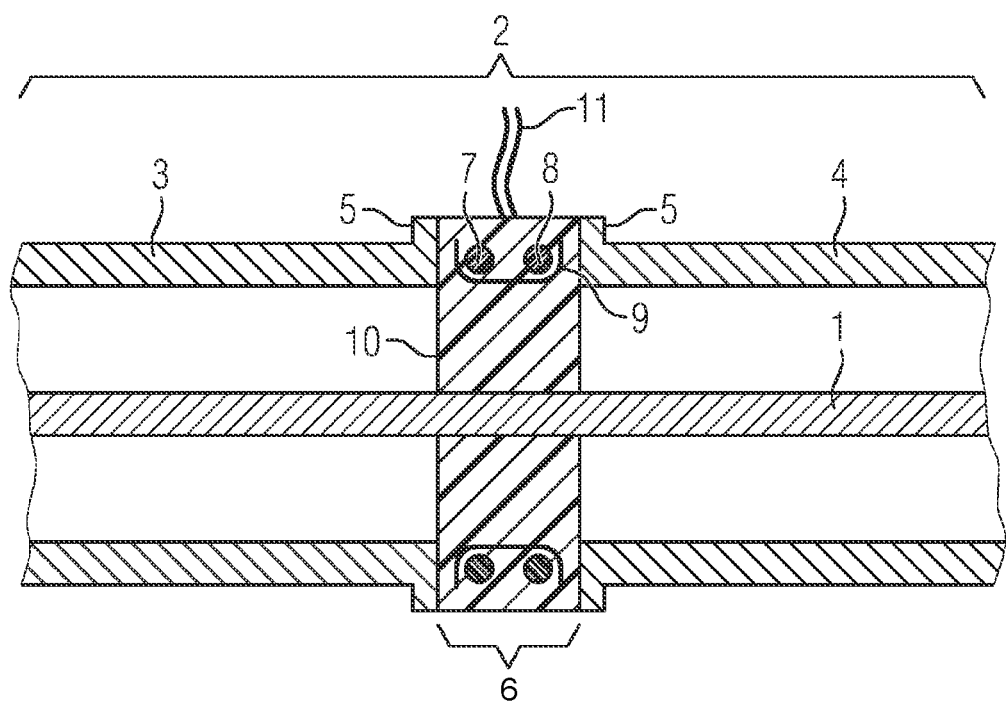
FIG. 1 shows a cross section through a gas-insulated electrical energy transmission device.

FIG. 1 shows a section through an electrical energy transmission device which has a phase conductor 1. The phase conductor 1 is arranged in electrically insulated fashion in the interior of an encapsulating housing 2. The encapsulating housing 2 has a first container 3 and a second container 4. The first and the second containers 3, 4 are designed to be substantially tubular, wherein the phase conductor 1 is arranged centrally in the interior of both the first and the second containers 3, 4. The two containers 3, 4 are flange-connected to one another via flanges 5. A measuring transformer 6 is arranged between the flanges 5 of the first and the second containers 3, 4. The measuring transformer 6 has a first Rogowski coil 7 and a second Rogowski coil 8. The Rogowski coils 7, 8 should be considered as being substantially annular, wherein the two Rogowski coils 7, 8 are positioned on a ring electrode 9 on the outer curve side. The two Rogowski coils 7, 8 and the ring electrode 9 are enclosed in an insulating material body 10. Connecting lines 11 (winding ends) are passed out of the insulating material body 10 in order to be able to make contact with the Rogowski coils 7, 8 located in the interior of the insulating material body 10 or the ring electrode 9. The insulating material body 10 is designed to be substantially complimentary in terms of shape to the cross section of the flanges 5, with the result that it can be introduced in fluid-tight fashion into the flange joint produced by the flanges 5 of the first and second containers 3, 4. The insulating material body 10 has the phase conductor 1 passing through it centrally in fluid-tight fashion. As a result, the insulating material body 10 or the measuring transformer 6 in the encapsulating housing 2 forms a fluid-tight barrier. Firstly, a fluid-tight termination of the end-side end at the flange 5 of the first container 3 is provided. Secondly, a fluid-tight termination of the end-side end at the flange 5 of the second container 4 is provided. It is thus possible to fill the interior of the first container 3 and the interior of the second container 4 in each case with an electrically insulating gas. Owing to the fluid-tight closure of the flanges 5 of the encapsulating housing 2, volatilization of the gas located in the interior of the encapsulating housing 2 or passage between the containers 3, 4 is virtually prevented. The electrically insulating gas can also be subjected to excess pressure in the interior of the encapsulating housing 2, with the result that the dielectric strength thereof is further increased. The design of the Rogowski coils 7, 8 or of the ring electrode 9 as well as the insulating material body 10 is described below with reference to FIGS. 2 to 5.

Figure 2:
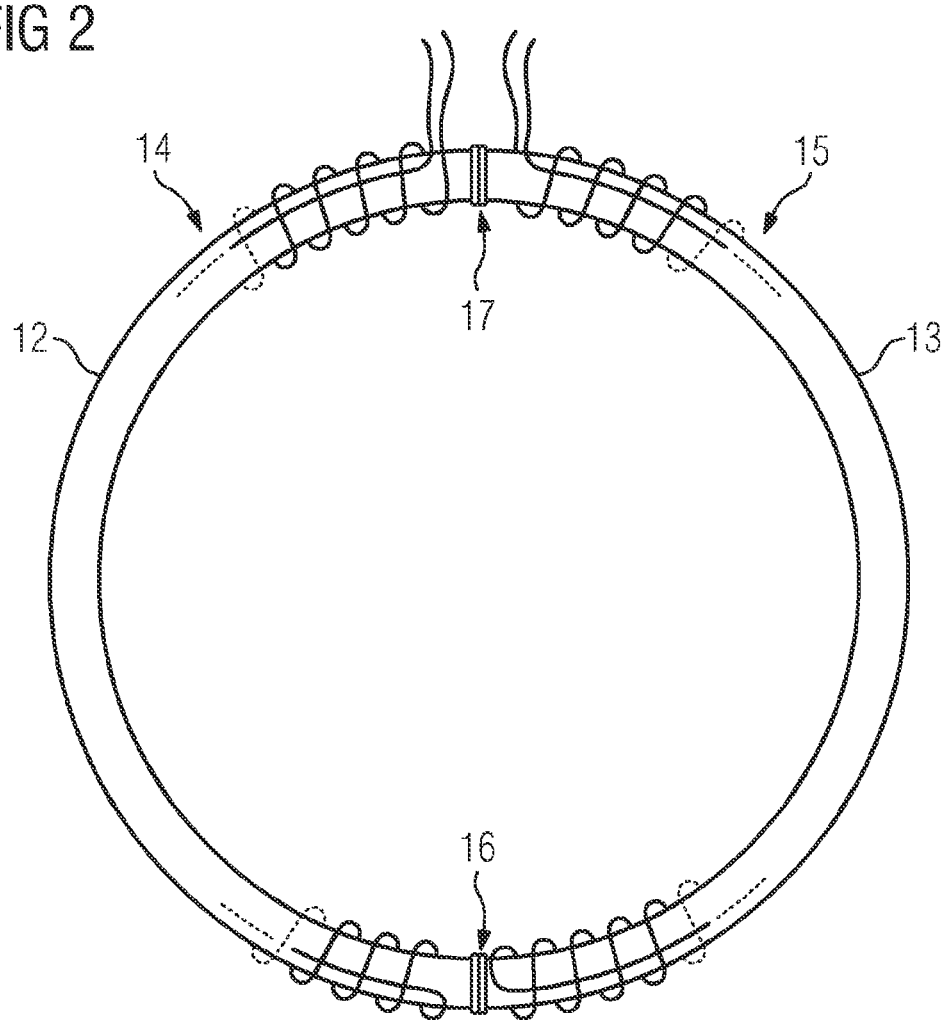
FIG. 2 shows a plan view of a winding support as well as a spiraled conductor strand.

FIG. 2 shows, by way of example, a first variant embodiment of a Rogowski coil 7, 8. The first variant embodiment of a Rogowski coil 7, 8 has a winding support. The winding support is in this case circular and comprises a first and a second segment 12, 13. The winding support or the segments 12, 13 of the winding support are formed from an electrically insulating material. This is preferably a homogeneous electrically insulating material such as, for example, a casting resin. Preferably, the winding support can be formed from the same material as the insulating material body 10 which encloses the winding support as well as Rogowski coils 7, 8 in its interior (cf. FIG. 1 and FIG. 6). The two segments 12, 13 are each in the form of half-rings, wherein in each case a first and a second abutment 16, 17 are arranged between end sides of the segments 12, 13. The segments 12, 13 each have a substantially circular cross section, around which a conductor strand has been spiraled. In this case, the conductor strand is assembled from a first strand element 14 and a second strand element 15. The segments 12, 13 are assembled to form a ring-shaped winding support whilst forming the first abutment 16 and the second abutment 17. The strand elements 14, 15 have been wound, starting from the second abutment 17, onto in each case one of the segments 12, 13, wherein when the end of the respective segment 12, 13 has been reached at the first abutment 16, a turning point has been formed in the respective strand element of the conductor strand, whereupon there is a change in the direction of the layers of the helix loops. Correspondingly, a crossover of the two helices on the respective segment 12, 13 is provided between the helix of the forward winding to the turning point with respect to the backward winding of the helix from the turning point of the respective strand element 14, 15. This embodiment corresponds to the nature of the embodiment of the strand elements 14, 15 as shown in FIGS. 3 to 6. As an alternative, it is illustrated symbolically in FIG. 2 that each strand element 14, 15 has been wound as a helix onto its segment 12, 13, wherein the strand element 14, 15 is passed back in a manner free of helix loops within the helix formed by it. The passing back can take place in such a way that, first, from one end of the respective segment 12, 13, the passed-back portion of the strand element 14, 15 is laid on the surface of the segments 12, 13, and that, then, the helix is spiraled around the respective segment 12, 13 towards the free end of the strand element (winding end) 14, 15 of the passed-back portion. Correspondingly, the free ends of the strand element (winding ends) 14, 15 lie at the same end of the segment 12, 13. Correspondingly, a Rogowski coil 7, 8 with a center tap is formed, which is located at the second abutment 17. At the first abutment 16, the abutment 16 itself is left free, with the result that said abutment is not bridged by a conductor strand or a strand element 14, 15. Correspondingly, at the second abutment 17, both the starts of the strand elements 14, 15 and the ends of the strand elements 14, 15 are located. Given such a configuration, it is possible to provide each of the segments 12, 13 with an identical type of winding, with the result that, in the convolution around the winding support, a uniform turns profile of the Rogowski coil 7, 8 is continually provided. A detailed position of the conductor strands 14, 15 and of the first abutment 16 and the second abutment 17 being left free and being bridged, respectively, is shown with reference to the exemplary embodiment in FIGS. 3 and 4. In said figures, the use of a helix is provided for the passed-back portion.

Figure 3:
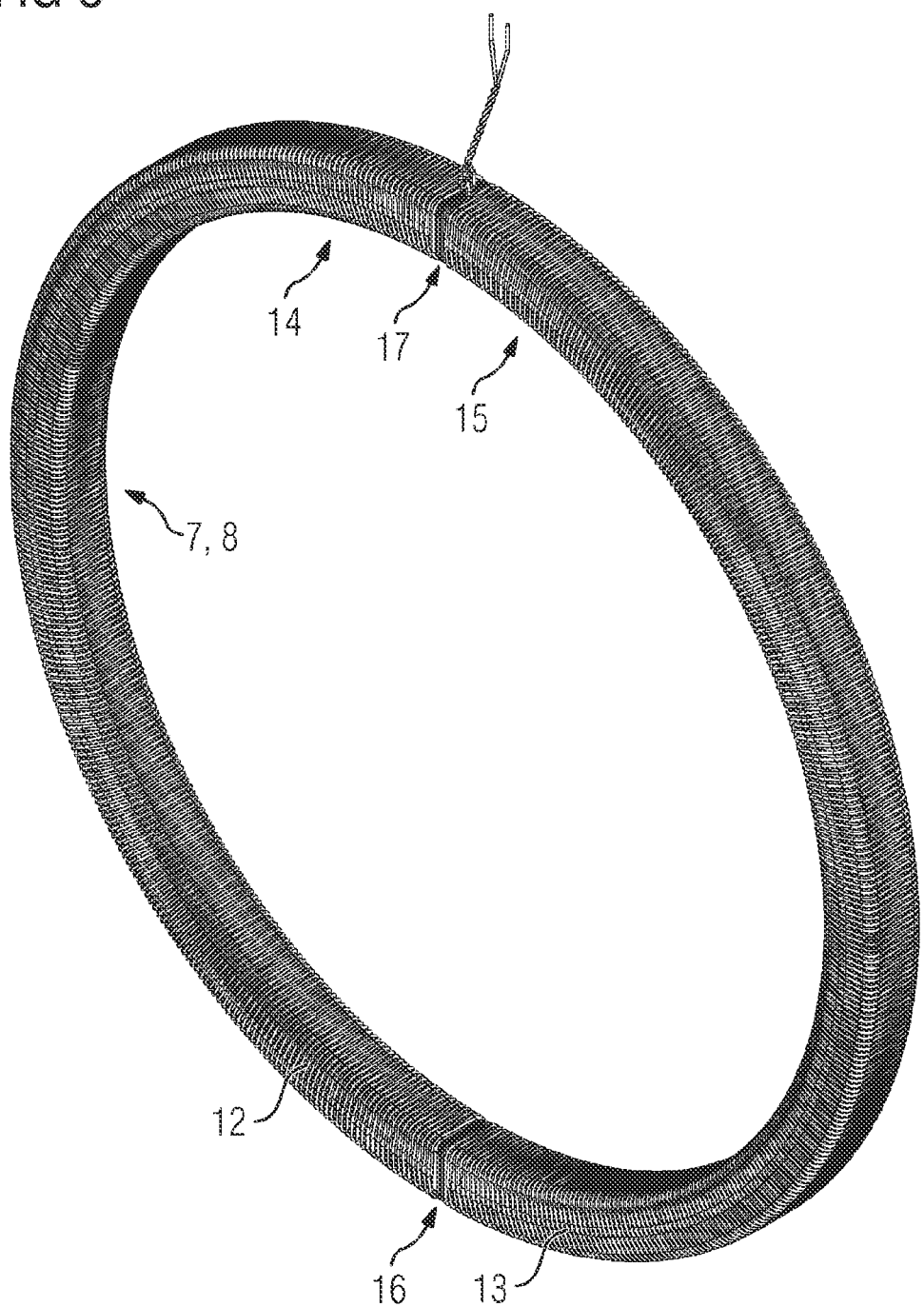
FIG. 3 shows a winding support with a rectangular cross section as well as a spiraled conductor strand.

FIG. 3 shows an annular Rogowski coil 7, 8, which has a rectangular cross section. The first and second segments 12, 13 are in this case identical to the variant embodiment shown in FIG. 2 apart from the embodiment of the cross section of the segments 12, 13. The segments 12, 13 and therefore also the winding support formed therefrom have a substantially rectangular cross section (cf. also FIG. 6), with the result that helix loops with rectangular cross sections are formed on the segments 12, 13. Provision is also made here for the second abutment 17 to be bridged between the two segments 12, 13 by an electrical conductor. In this case, this is formed by an electrical connection of first ends of the respective strand elements 14, 15 on the first and second segments 12, 13, respectively. In FIG. 3, each of the strand elements 14, 15 is formed in each case by a left-handed helix (white) and a right-handed helix (black), wherein the two helices of the respective strand element 14, 15 have substantially parallel helix loops on the winding support on the inner curve side and the outer curve side. A crossover of the individual turns of the helices is provided in the axial direction with respect to the ring axis of the winding support. In this case, a turning point is formed in the respective strand element 14, 15 at the ends of the segments 12, 13 at which the first abutment 16 is arranged, at which turning point the right-handed or left-handed helix of the respective strand element 14, 15 merge with one another/abut one another.

Owing to the turning towards one another of the ends of the segments 12, 13 at which in each case the turning points of the strand elements 14, 15 are arranged and the turning towards one another of the ends of the segments 12, 13 at which in each case the conductor ends of the respective strand elements 14, 15 end, segments 12, 13 which are wound in the same direction or identically as well as strand elements 14, 15 arranged thereon can be used because, as a result, a course runs in the same direction beyond the circumference of the winding support. Correspondingly, in each case the first segment 12 and the second segment 13 with the first strand element 14 and the second strand element 15 are wound identically. This has the advantage that the fitting of the segments 12, 13 is possible more easily since clear allocation of the ends of the segments 12, 13 at which connecting lines are located or the winding ends of the strand elements 14, 15 are arranged is performed and, secondly, abutment of the ends of the segments 12, 13 at which turning points of the strand elements 14, 15 are arranged is performed at the first abutment 16.

Figure 4:
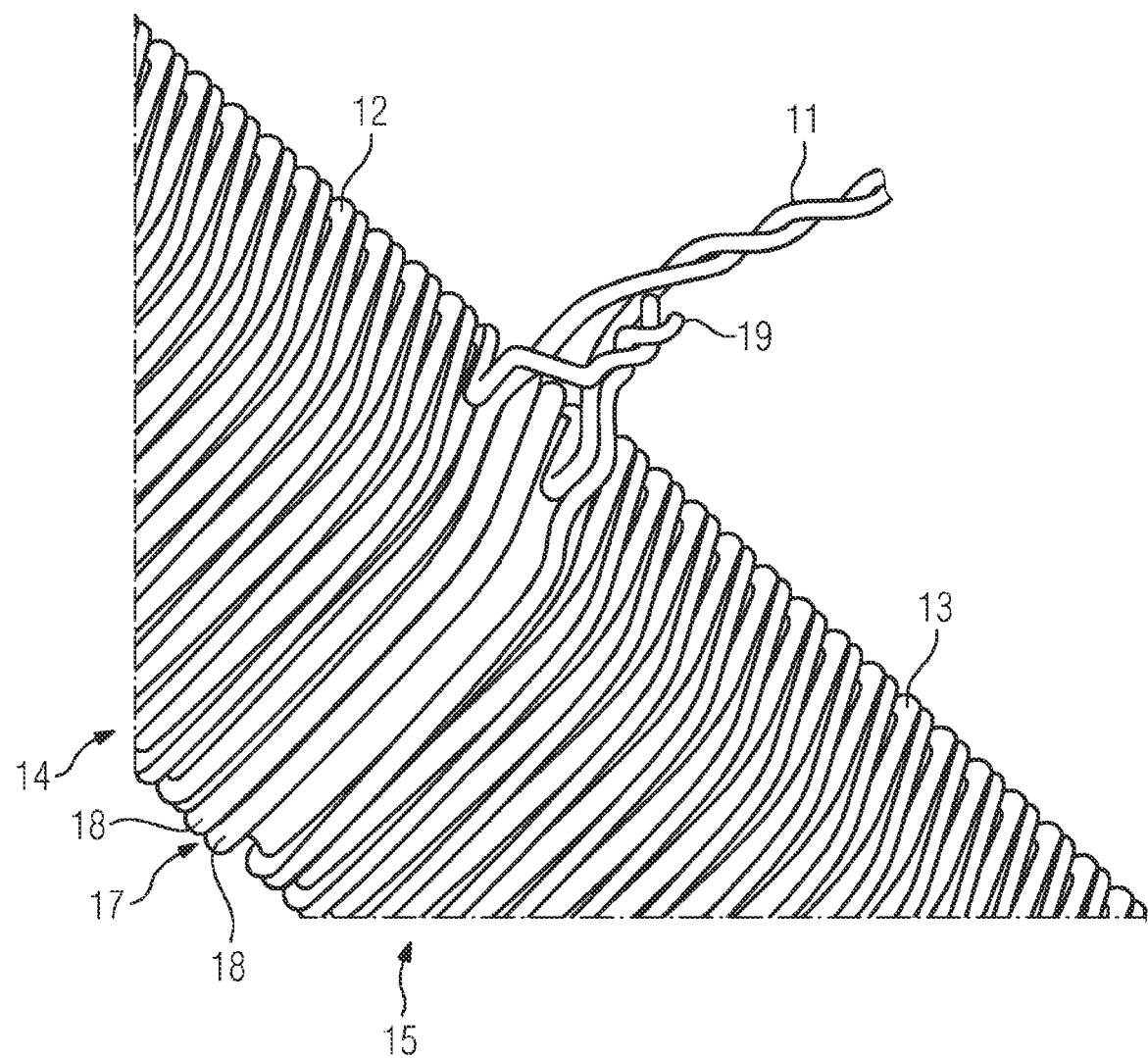
FIG. 4 shows a detail of the winding support known from FIG. 3 as well as a spiraled conductor strand.

FIG. 4 depicts a detail of the second abutment 17 as illustrated in FIG. 3. The two ends of the segments 14, 15 which form the second abutment 17 are shown. In order to prevent the spiraled-up strand elements 14, 15 from sliding off or being lost, the ends of the segments 12, 13 are each provided with a protruding stop 18. The protruding stops 18 are in each case formed in the manner of a collar, which runs around at the cross section of the respective winding segment 12, 13 at one end. The height of the stop or the height of the collar is in this case selected such that it approximately corresponds to the diameter of the strand elements 14, 15. It is therefore possible to wind the strand elements 14, 15 close to the end of the segment 12, 13, and to allow the turning point to stop at the respective protruding stop 18 of the segments 12, 13. Therefore, undesired sliding-off of the wound-up strand elements 14, 15 from the segments 12, 13 is prevented. It can further be seen from FIG. 4 that an approximately parallel position of the turns of the conductor strand is present on the outer curve side or the inner curve side on the winding support, whereas a crossover of the left-handed and right-handed helices on the respective segment 12, 13 takes place in the axial direction. Using the position of the two ends 19 of the strand elements 14, 15, which ends are in electrical contact with one another, it can be seen that they run towards one another from opposite directions, i.e. whilst maintaining the winding sense of the respective helix. The same also applies to the two connecting lines 11, which are likewise passed to the outside from opposite directions, i.e. whilst maintaining the winding sense of the respective helix. The winding ends 19, which are in electrically conductive contact with one another, in this case bridge the first abutment 16 and cross the latter. The same also applies to the connecting lines 11.

Figure 5:
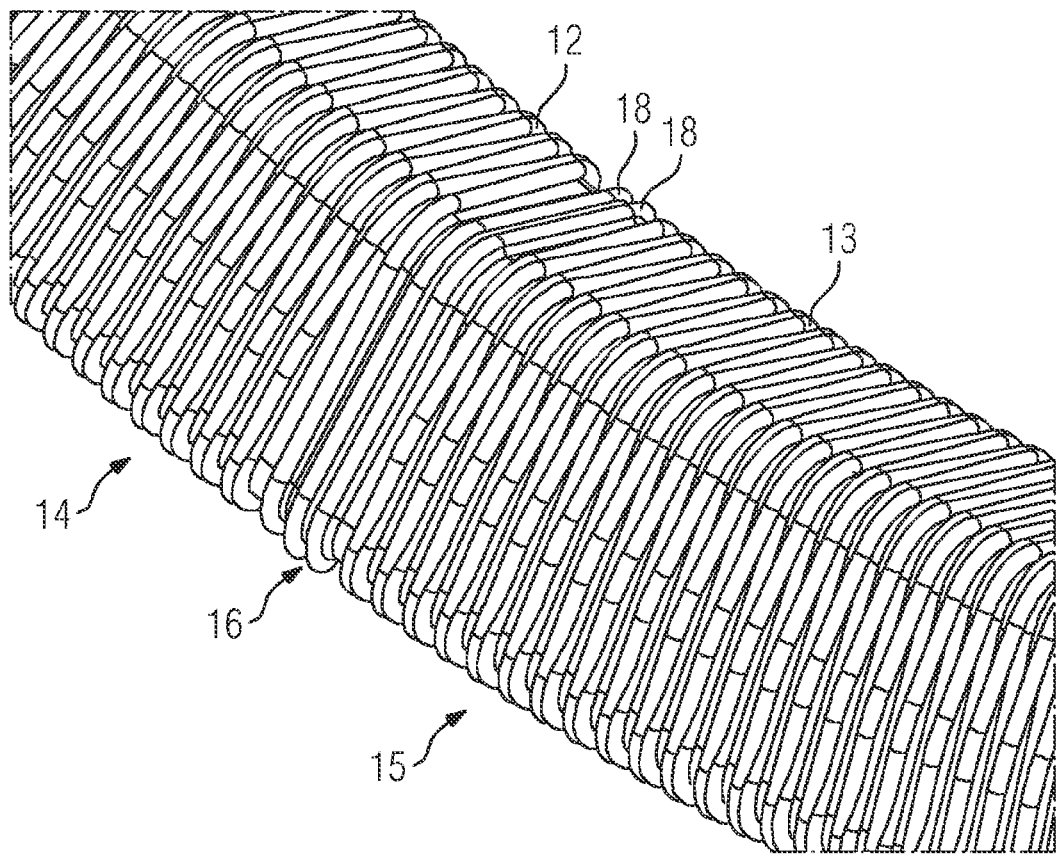
FIG. 5 shows a further detail of the winding support known from FIG. 3 as well as a spiraled conductor strand.

FIG. 5 depicts the first abutment 16 of the winding support shown in FIG. 3. There, the first abutment 16 is shown, which is formed between the mutually facing ends of the segments 12, 13. In this case, too, the use of protruding stops 18 in the form of circulating collars is provided in order to bound the turning points located in the region of the second abutment on both sides between the left-handed and right-handed helices of the strand elements 14, 15. The left-handed helices and the right-handed helices are in this case formed in such a way that in each case alternately conductor loops of a right-handed or left-handed helix are arranged on the inner curve side or the outer curve side. A crossover for evening up the layers takes place in the axial direction (at the end side) with respect to the inner curve surface or the outer curve surface of the winding support.

Figure 6:
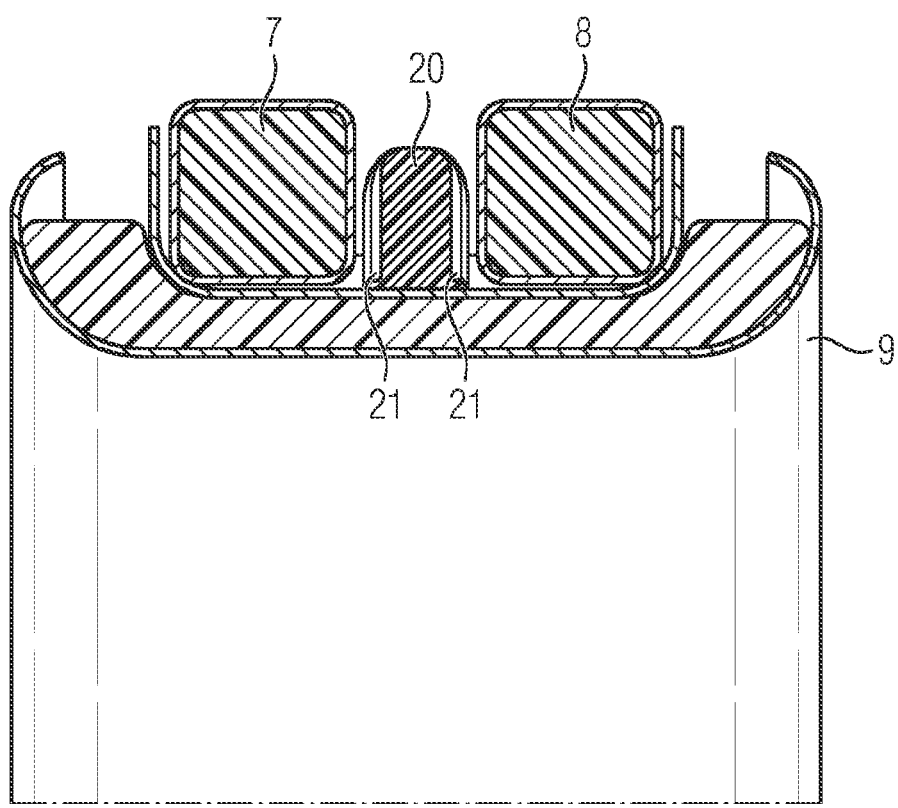
FIG. 6 shows a cross section through a measuring transformer comprising redundant winding supports and conductor strands.

FIG. 6 shows an arrangement of a winding support as well as a spiraled conductor strand on a ring electrode 9 in section. The ring electrode 9 is designed substantially corresponding to the illustration in FIG. 1, i.e. the ring electrode 9 is designed to be substantially hollow-cylindrical, wherein a rim base is formed on the outer curve side on the ring electrode 9. Two identically constructed winding bodies as well as conductor strands have been inserted into the rim base. Here, the design of the Rogowski coils 7, 8 with a center tap has proven to be advantageous for positioning opening winding supports on the ring electrode 9. Packing has been arranged in the rim base of the ring electrode 9 in order to centrally position the two Rogowski coils 7, 8. Furthermore, a spacer 20 has been arranged between the Rogowski coils 7, 8. Both the spacer 20 and the packing in the bottom of the rim base of the ring electrode 9 and the insulating material body 10 yet to be produced are preferably formed from the same insulating material. The spacer 20 spaces apart the Rogowski coils 7, 8 from one another and has cutouts 21, which are substantially aligned in the radial direction. There is therefore the possibility of passing the in the meantime liquid insulating material even into narrowed areas or inner curve sides of the Rogowski coils 7, 8 during potting of the Rogowski coils 7, 8 to form an insulating material body 10 and to perform potting, preferably without any inclusions, with an electrically insulating liquid material, with the result that a block-type insulating material body 10 is formed.

Preferably, potting is performed in a die to form an insulating material body 10 which is substantially cylindrical.

The invention claimed is:

1. An arrangement, comprising:
a spiraled conductor strand; and
an annular winding support supporting said spiraled conductor strand, said winding support having a first abutment and a second abutment, and said winding support including a plurality of mutually abutting segments;
said spiraled conductor strand ending on both sides of at least said first abutment but leaving said first abutment free of said conductor strand, and said spiraled conductor strand running beyond said second abutment; and
an insulating body, said winding support and said spiraled conductor strand being potted in said insulating body.

2. The arrangement according to claim 1, wherein at least one of said mutually abutting segments has a radially protruding stop preventing said spiraled conductor strand from sliding off at an end.

3. The arrangement according to claim 1, wherein said winding support has a coefficient of thermal expansion being less than or equal to a coefficient of thermal expansion of said insulating body.

4. The arrangement according to claim 1, wherein:
two of said strand elements each have two end-side ends;
one of said end-side ends of each of said two strand elements are brought into contact with one another at mutually abutting segments; and
another of said end-side ends of each of said two strand elements serve as taps for a measurement signal.

5. The arrangement according to claim 4, wherein said taps of said other of said end-side ends of said strand elements are located at an alike one of said abutments.

6. The arrangement according to claim 1, wherein:
said annular winding support is one of two annular winding supports disposed coaxially relative to one another; and
a spacer is disposed between said two annular winding supports prior to potting in said insulating body, said spacer having substantially radially aligned channels.

7. The arrangement according to claim 1, wherein the arrangement forms a measuring transformer in a pressurized-fluid-insulated electrical energy transmission device.

8. An arrangement, comprising:
a spiraled conductor strand including a plurality of strand elements; and
an annular winding support supporting said spiraled conductor strand, said winding support having a first abutment and a second abutment, and said winding support including a plurality of mutually abutting segments;
said spiraled conductor strand ending on both sides of at least said first abutment but leaving said first abutment free of said conductor strand, and said spiraled conductor strand running beyond said second abutment;
said spiraled conductor strand or one of said strand elements being wound onto one of said mutually abutting segments to initially wind a left-handed helix and, upon reaching an end of a segment, to insert a right-handed helix into free spaces located between helix loops of said left-handed helix, or vice versa, with respective crossing-over of said left-handed and right-handed helices.

9. The arrangement according to claim 8, wherein
said spiraled conductor strand or one of said strand elements has a winding end surrounded by said helix and passed back within said helix.

10. The arrangement according to claim 8, wherein said mutually abutting segments are constructed alike and each support a respective alike one of said strand elements of said conductor strand.

11. A method for producing a measuring transformer, the method comprising:
providing a winding support as an insulating ring having a first segment and a second segment;
winding a spiraled conductor strand as a crossing-over helix onto the annular winding support by initially winding a first helix onto the first segment and winding a second helix onto the second segment;
joining the first and second segments together to form a ring in a rim base of a ring electrode; and
potting the first and second segments, the first and second helices and the ring electrode in an insulating material.

* * * * *